US009899348B2

(12) United States Patent
Sekine (10) Patent No.: US 9,899,348 B2
(45) Date of Patent: Feb. 20, 2018

(54) WIRE BONDING APPARATUS AND METHOD OF MANUFACTURING SEMICONDUCTOR DEVICE

(71) Applicant: SHINKAWA LTD., Tokyo (JP)

(72) Inventor: Naoki Sekine, Tokyo (JP)

(73) Assignee: SHINKAWA LTD., Tokyo (JP)

(*) Notice: Subject to any disclaimer, the term of this patent is extended or adjusted under 35 U.S.C. 154(b) by 18 days.

(21) Appl. No.: 15/235,121

(22) Filed: Aug. 12, 2016

(65) Prior Publication Data

US 2016/0351537 A1  Dec. 1, 2016

Related U.S. Application Data

(63) Continuation of application No. PCT/JP2015/053664, filed on Feb. 10, 2015.

(30) Foreign Application Priority Data

Feb. 14, 2014 (JP) ................................. 2014-026673

(51) Int. Cl.

| B23K 31/02 | (2006.01) |
|---|---|
| H01L 23/00 | (2006.01) |
| B23K 20/00 | (2006.01) |
| B23K 35/28 | (2006.01) |
| B23K 35/02 | (2006.01) |
| H01L 21/48 | (2006.01) |
| B23K 101/40 | (2006.01) |

(52) U.S. Cl.
CPC ............ *H01L 24/85* (2013.01); *B23K 20/004* (2013.01); *B23K 35/0227* (2013.01);
(Continued)

(58) Field of Classification Search
CPC ......... H01L 24/85; H01L 21/48; H01L 24/78; H01L 2224/7855; H01L 2224/78901;
(Continued)

(56) References Cited

U.S. PATENT DOCUMENTS

| 4,821,944 A | * | 4/1989 | Tsumura | ................ B23K 13/01 |
|---|---|---|---|---|
| | | | | 219/56.21 |
| 5,468,927 A | * | 11/1995 | Terakado | ............. B23K 20/007 |
| | | | | 219/56.21 |

(Continued)

FOREIGN PATENT DOCUMENTS

| JP | 55113338 A | * | 9/1980 | |
|---|---|---|---|---|
| JP | 61084844 A | * | 4/1986 | ............. H01L 24/78 |

(Continued)

OTHER PUBLICATIONS

"Written Opinion (Form PCT/ISA/237)", dated May 14, 2015, with English translation thereof, pp. 1-8.

*Primary Examiner* — Kiley Stoner (74) *Attorney, Agent, or Firm* — JCIPRNET (57) ABSTRACT

A wire bonding apparatus includes: a bonding tool 40 into and through a wire 42 passes; a control unit 80 that performs a movement process of the bonding tool 40 for cutting the wire 42 after forming a wire loop 90 between first and second bonding points of a bonding target 100; and a monitoring unit 70 that supplies a predetermined electric signal between the wire 42 through the bonding tool 40 and the bonding target 100, and monitors whether the wire 42 is cut or not based on an output of the supplied electric signal. The control unit 80 continues the movement process of the bonding tool 40 while the wire 42 is determined not to be cut, and stops the movement process of the bonding tool 40 when the wire 42 is determined to be cut, based on a monitoring result from the monitoring unit 70. This can shorten the operation time of the wire bonding, and improve the process efficiency of the wire bonding.

9 Claims, 6 Drawing Sheets

(52) U.S. Cl.
CPC ........ B23K 35/0261 (2013.01); B23K 35/286 (2013.01); H01L 21/48 (2013.01); H01L 24/78 (2013.01); *B23K 2201/40* (2013.01); *H01L 24/45* (2013.01); *H01L 24/48* (2013.01); *H01L 2224/45124* (2013.01); *H01L 2224/45139* (2013.01); *H01L 2224/45144* (2013.01); *H01L 2224/45147* (2013.01); *H01L 2224/48091* (2013.01); *H01L 2224/48227* (2013.01); *H01L 2224/48455* (2013.01); *H01L 2224/48472* (2013.01); *H01L 2224/789* (2013.01); *H01L 2224/7855* (2013.01); *H01L 2224/78301* (2013.01); *H01L 2224/78611* (2013.01); *H01L 2224/78901* (2013.01); *H01L 2224/851* (2013.01); *H01L 2224/859* (2013.01); *H01L 2224/85181* (2013.01); *H01L 2224/85205* (2013.01); *H01L 2924/00014* (2013.01)

(58) Field of Classification Search
CPC ..... H01L 2224/851; H01L 2224/48455; H01L 2224/78611; H01L 2924/00014; H01L 2224/789; H01L 2224/859; H01L 24/48; H01L 2224/85205; H01L 2224/45147; H01L 2224/45139; H01L 24/45; H01L 2224/45144; H01L 2224/45124; H01L 2224/48472; H01L 2224/48227; H01L 2224/48091; H01L 2224/78301; H01L 2224/85181; B23K 35/0227; B23K 35/0261; B23K 35/286; B23K 20/004; B23K 2201/40
USPC ............. 228/180.5, 4.5, 904, 102–103, 8–11
See application file for complete search history.

(56) References Cited

U.S. PATENT DOCUMENTS

| | | | | |
|---|---|---|---|---|
| 5,591,920 A * | 1/1997 | Price | ................... | B23K 31/125 228/4.5 |
| 5,685,476 A * | 11/1997 | Miyoshi | ............... | B23K 20/007 228/180.5 |
| 6,667,625 B1 * | 12/2003 | Miller | ................. | B23K 20/004 228/104 |
| 9,368,471 B2 | 6/2016 | Akiyama et al. | | |
| 9,502,378 B1 * | 11/2016 | Lee; Ki Yong | ......... | H01L 24/85 |
| 2005/0061849 A1 * | 3/2005 | Takahashi | ............ | B23K 20/004 228/4.5 |
| 2007/0187138 A1 * | 8/2007 | Takahashi | ............... | H01L 24/78 174/257 |
| 2007/0246513 A1 * | 10/2007 | Tei | ........................ | H01L 24/85 228/101 |
| 2008/0099532 A1 * | 5/2008 | Nakao | .................. | B23K 20/005 228/102 |
| 2009/0200357 A1 * | 8/2009 | Lee | ....................... | B23K 20/007 228/44.7 |
| 2010/0045328 A1 * | 2/2010 | Suto | ...................... | G01R 31/046 324/754.01 |
| 2010/0200284 A1 * | 8/2010 | Seki | .................... | H01L 21/4853 174/260 |
| 2013/0257450 A1 * | 10/2013 | Omori | .................. | G01R 31/026 324/543 |
| 2015/0123283 A1 * | 5/2015 | Bae | ........................ | H01L 24/85 257/774 |
| 2015/0200143 A1 * | 7/2015 | Gillotti | ................... | H01L 24/78 228/104 |
| 2016/0351538 A1 * | 12/2016 | Hagiwara | ............... | H01L 24/78 |

FOREIGN PATENT DOCUMENTS

| | | | | |
|---|---|---|---|---|
| JP | 63077131 A * | 4/1988 | ............ | H01L 24/78 |
| JP | 04162441 A * | 6/1992 | ............ | H01L 24/78 |
| JP | H07335681 | 12/1995 | | |
| JP | 2507698 B2 * | 6/1996 | ............ | H01L 24/78 |
| JP | 2568140 B2 * | 12/1996 | ............ | H01L 24/78 |
| JP | 11243119 A * | 9/1999 | ............ | H01L 24/78 |
| JP | 2003318216 | 11/2003 | | |
| JP | 2005184009 A * | 7/2005 | .......... | B23K 20/004 |
| JP | 2010123854 | 6/2010 | | |
| JP | 2013157594 | 8/2013 | | |
| JP | 2013157594 A * | 8/2013 | ............ | H01L 24/78 |

* cited by examiner

WIRE BONDING APPARATUS AND METHOD OF MANUFACTURING SEMICONDUCTOR DEVICE

CROSS REFERENCE TO RELATED APPLICATIONS

This application is a Continuation of PCT International Application No. PCT/JP2015/053664, filed on Feb. 10, 2015, which claims priority under 35 U.S.C §119(a) to Patent Application No. 2014-026673, filed in Japan on Feb. 14, 2014, all of which are hereby expressly incorporated by reference into the present application.

TECHNICAL FIELD

The present invention relates to a wire bonding apparatus and a method of manufacturing a semiconductor device.

BACKGROUND

In manufacturing semiconductor devices, for example, wire bonding is widely used to electrically connect electrodes on a semiconductor chip to electrodes on a substrate with wires. A wedge bonding system is known as one type of wire bonding method. This system involves connecting a wire to a bonding target without forming any balls at the tip of the wire. In such a wedge bonding system, the wire is connected between a first bonding point and a second bonding point. Subsequently, a bonding tool is moved in an XY direction parallel to a bonding surface to cut the wire, thereby forming a wire tail at the tip of the bonding tool. This wire tail is then bonded to a first bonding point for the next wire bonding without performing a ball-formation process (see Patent Document 1).

Conventionally, a movement process of the bonding tool for cutting the wire is performed by an operator's presetting of a parameter (movement distance). To prevent the occurrence of cutting failures of the wire, the setting is generally executed by securing an extra movement distance. For this reason, although the wire is already cut in reality, the bonding tool is moved additionally in some cases, wasting the operating time for a wire bonding apparatus. For the wire bonding, various kinds of parameters need to be set. Thus, it is preferred that the number of parameters to be preset is small.

CITATION LIST

Patent Document

Patent Document 1: Japanese Unexamined Patent Application Publication No. 2003-318216

SUMMARY OF THE INVENTION

Technical Problem

Accordingly, it is that the present invention provides a wire bonding apparatus and a method of manufacturing a semiconductor device that can solve the above-mentioned problems.

Solution to Problem

A wire bonding apparatus according to an aspect of the present invention includes: a bonding tool for allowing a wire to be inserted thereinto and to pass therethrough; a control unit that performs a movement process of the bonding tool for cutting the wire after forming a wire loop between a first bonding point and a second bonding point of a bonding target; and a monitoring unit that supplies a predetermined electric signal between the wire inserted into and passing through the bonding tool and the bonding target, and monitors whether the wire is cut or not based on an output of the supplied electric signal. Here, the control unit is configured to continue the movement process of the bonding tool during a period in which the wire is determined not to be cut, and to stop the movement process of the bonding tool when the wire is determined to be cut, based on a monitoring result from the monitoring unit.

With the arrangement described above, whether the wire is cut or not is monitored based on the output of the electric signal supplied between the wire and the bonding target. The movement process of the bonding tool for cutting the wire is stopped when the wire is determined to be cut based on the monitoring result. Thus, for example, the movement process of the bonding tool is terminated at the same time as the cutting of the wire, and can be quickly transferred to a subsequent movement process, which can shorten the operation time for the wire bonding. The cutting process of the wire can be automated, so that setting of a parameter associated with the wire bonding can be simplified. Thus, the process efficiency of the wire bonding can be improved.

In the above-mentioned wire bonding apparatus, the predetermined electric signal can be an alternate-current electric signal.

In the above-mentioned wire bonding apparatus, an output of the supplied electric signal is an output associated with a capacitance between the wire and the bonding target, and the monitoring unit can be configured to determine whether the wire is cut or not based on comparison between the output associated with the capacitance and a predetermined threshold.

In the above-mentioned wire bonding apparatus, the monitoring unit can be configured to indicate that cutting of the wire is abnormal when the wire is determined to be cut before starting the movement process of the bonding tool for cutting the wire.

In the above-mentioned wire bonding apparatus, the wire bonding to be performed on the bonding target can be a wedge bonding system.

In the above-mentioned wire bonding apparatus, the movement process of the bonding tool for cutting the wire can include moving the bonding tool in a direction parallel to a bonding surface.

In the above-mentioned wire bonding apparatus, the control unit can be configured to move the bonding tool in a direction vertical to a bonding surface while stopping the movement process of the bonding tool for cutting the wire, when the monitoring unit determines that the wire is cut.

In the above-mentioned wire bonding apparatus, the wire can be an aluminum wire.

A method of manufacturing a semiconductor device according to another aspect of the present invention involves cutting a wire after forming a wire loop between a first bonding point and a second bonding point of a bonding target by means of a bonding tool, the method comprising: supplying a predetermined electric signal between a wire inserted into and passing through the bonding tool and the bonding target, thereby monitoring whether the wire is cut or not based on an output of the supplied electric signal. Here, the wire cutting step includes continuing the movement process of the bonding tool for cutting the wire during a period in which the wire is determined not to be cut, and stopping the movement process of the bonding tool when the wire is determined to be cut, based on a result of the monitoring.

With the arrangement described above, whether the wire is cut or not is monitored based on the output of the electric signal supplied between the wire and the bonding target. The movement process of the bonding tool for cutting the wire is stopped when the wire is determined to be cut based on the monitoring result. Thus, for example, the movement process of the bonding tool is terminated at the same time as the cutting of the wire, and then can be quickly transferred to a subsequent movement process, which can shorten the operation time for the wire bonding. The cutting process of the wire can be automated, so that setting of a parameter associated with the wire bonding can be simplified. Thus, the process efficiency of the wire bonding can be improved.

Advantageous Effects of the Invention

The present invention can shorten the operation time for wire bonding and improve the process efficiency of the wire bonding.

DESCRIPTION OF EMBODIMENTS

Embodiments of the present invention will be described below. In the following description of the drawings, the same or similar components are designated by the same or similar reference characters. The drawings are illustrative only, the dimensions and geometries of various parts are schematic only, and the technical scope of the present invention should not be understood as being limited to the embodiments.

Figure 1:
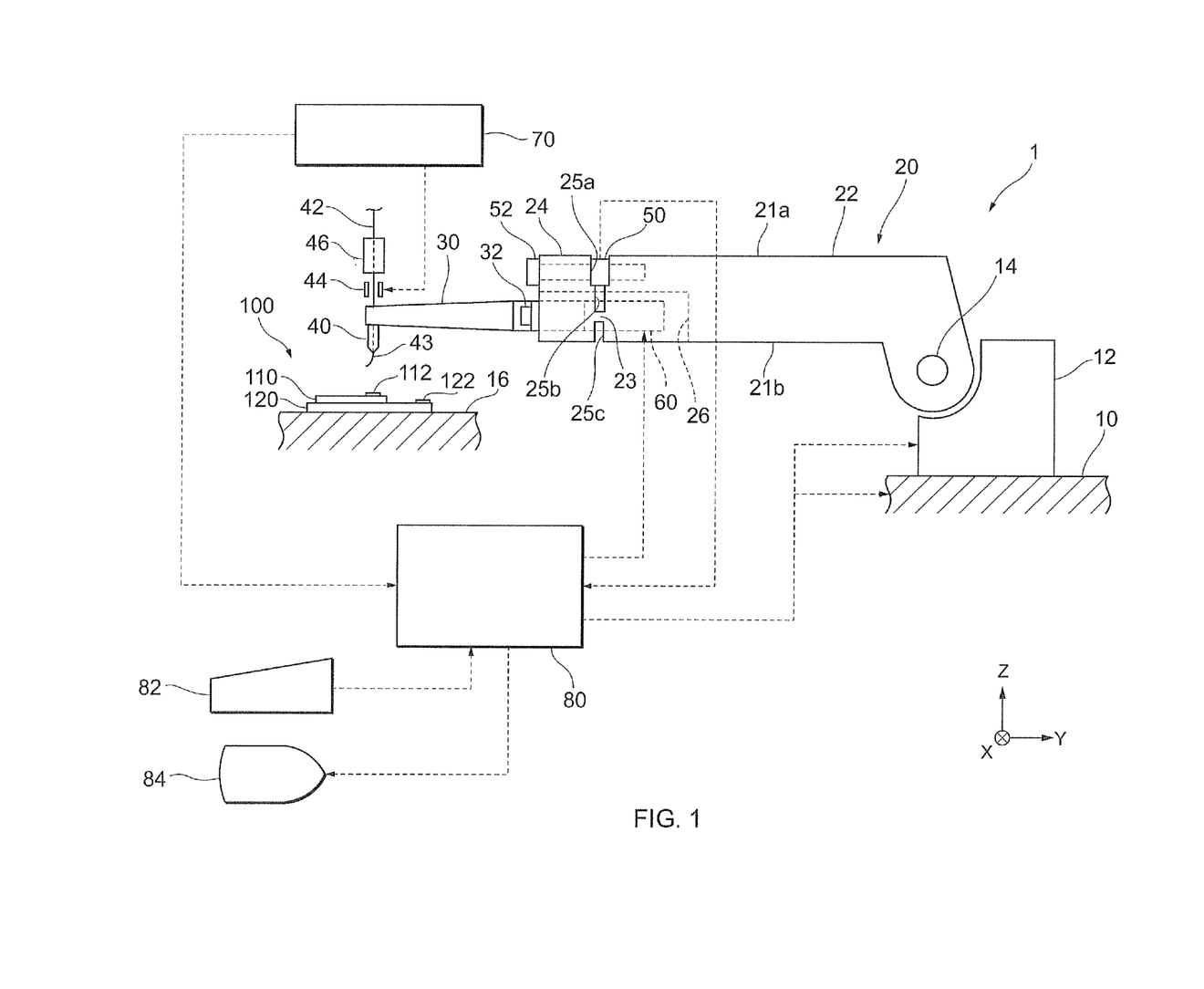
FIG. 1 is a diagram illustrating a wire bonding apparatus according to an embodiment.
Figure 2:
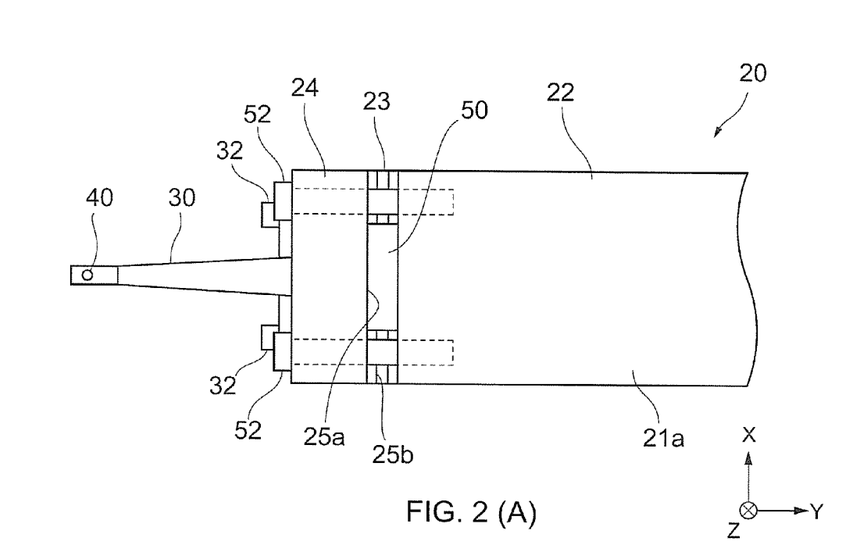
FIGS. 2(A) and 2(B) are top and bottom plan views in a plane of a bonding arm of the wire bonding apparatus according to the embodiment.

FIG. 1 illustrates a wire bonding apparatus according to an embodiment, and FIGS. 2(A) and 2(B) are partially enlarged views of a bonding arm of the wire bonding apparatus, where FIG. 2(A) is a top plan view of the bonding arm, and FIG. 2(B) is a bottom plan view of the bonding arm.

As shown in FIG. 1, the wire bonding apparatus 1 includes an XY drive mechanism 10, a Z drive mechanism 12, a bonding arm 20, an ultrasonic horn 30, a bonding tool 40, a load sensor 50, an ultrasonic vibrator 60, a monitoring unit 70, and a control unit 80.

The XY drive mechanism 10 is configured to be movable in the X and Y axis directions (i.e. the direction parallel to a bonding surface), and the XY drive mechanism (linear motor) 10 is provided with the Z drive mechanism (linear motor) 12 capable of moving the bonding arm 20 in the Z axis direction (i.e. the direction vertical to the bonding surface).

The bonding arm 20 is supported by an arm supporting shaft 14 and configured to be swingable with respect to the XY drive mechanism 10. The bonding arm 20 is formed in a substantially rectangular parallelepiped shape so as to extend from the XY drive mechanism 10 toward a bonding stage 16 on which a bonding target 100 is placed. The bonding arm 20 includes an arm base end portion 22 attached to the XY drive mechanism 10, an arm end portion 24 positioned on the end side of the arm base end portion 22 and equipped with the ultrasonic horn 30, and a flexible connecting portion 23 connecting the arm base end portion 22 and the arm end portion 24. The connecting portion 23 is formed by slits 25a and 25b extending in a direction from a top surface 21a toward a bottom surface 21b of the bonding arm 20 and having a predetermined width as well as a slit 25c extending in a direction from the bottom surface 21b toward the top surface 21a of the bonding arm 20 and having a predetermined width. The connecting portion 23 is locally formed as a thin portion by the slits 25a, 25b, and 25c in this way, whereby the arm end portion 24 is flexible with respect to the arm base end portion 22.

As shown in FIGS. 1 and 2(B), a recessed portion 26 in which the ultrasonic horn 30 is accommodated is formed at the bottom surface 21b side of the bonding arm 20. The ultrasonic horn 30 is attached to the arm end portion 24 by a horn fixing screw 32 while being accommodated in the recessed portion 26 of the bonding arm 20. The ultrasonic horn 30 has its end protruding from the recessed portion 26 and holding the bonding tool 40. The ultrasonic vibrator 60 for generating ultrasonic vibrations is provided in the recessed portion 26. Ultrasonic vibrations can be produced by the ultrasonic vibrator 60, transmitted to the bonding tool 40 through the ultrasonic horn 30, and imparted to the bonding target via the bonding tool 40. The ultrasonic vibrator 60 is, for example, a piezoelectric vibrator.

As shown in FIGS. 1 and 2(A), the slits 25a and 25b are formed at the top surface 21a side of the bonding 20 from the top surface 21a toward the bottom surface 21b in this order. The upper slit 25a is formed more widely than the lower slit 25b. The load sensor 50 is provided in the upper slit 25a formed widely. The load sensor 50 is fixed to the arm end portion 24 with a pre-compressing screw 52. The load sensor 50 is disposed to be sandwiched between the arm base end portion 22 and the arm end portion 24. That is, the load sensor 50 is offset from the central axis in the longitudinal direction of the ultrasonic horn 30, with respect to the bonding target in a contact/separate direction. Further, the load sensor 50 is attached between the rotational center of the bonding arm 20 and an attachment surface of the arm end portion 24 to the ultrasonic horn 30 (i.e., the end surface on the bonding tool 40 side of the arm end portion 24). As mentioned above, the ultrasonic horn 30 for holding the bonding tool 40 is attached to the arm end portion 24. Once a load is applied to the tip of the bonding tool 40 due to a reaction force from the bonding target, the arm end portion 24 is bent relative to the arm base end portion 22, which allows the load sensor 50 to detect the load. The load sensor 50 is, for example, a piezoelectric load sensor.

Figure 4:
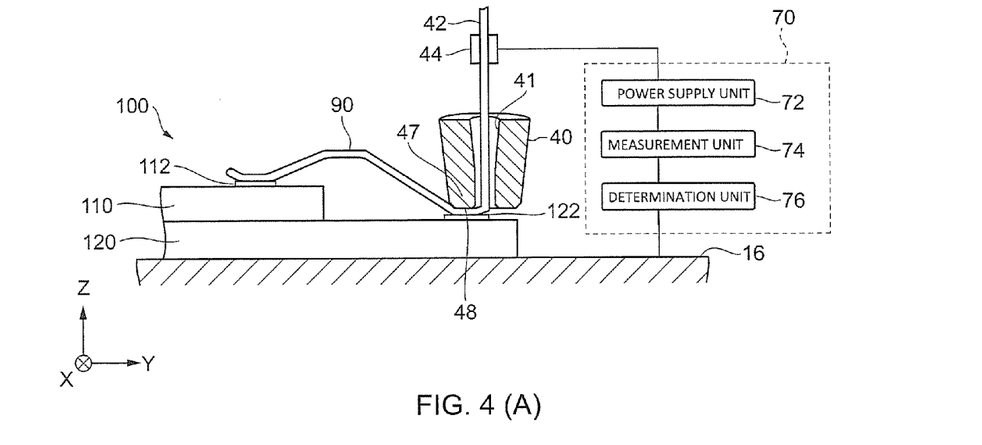
FIGS. 4(A) and 4(B) are diagrams for explaining the manufacturing method of a semiconductor device in the embodiment, while showing one example of a structure of a monitoring unit according to the embodiment.

The bonding tool 40 is to permit a wire 42 to pass therethrough, and for example, is a capillary provided with an insertion hole 41 (see FIG. 4(A)). In this case, the wire 42 to be used for bonding is inserted into the insertion hole 41 of the bonding tool 40, whereby a portion of the wire 42 can be paid out from the tip of the bonding tool 40. A pressing portion 47 for pressing the wire 42 is provided at the tip of the bonding tool 40 (see FIG. 4(A)). The pressing portion 47 is rotationally symmetric about the axis of the insertion hole 41 of the bonding tool 40, and has a pressing surface 48 at its lower surface around the insertion hole 41.

The bonding tool 40 is attached to the ultrasonic horn 30 in such a manner as to be replaceable by the use of a spring force and the like. A wire damper 44 is provided above the bonding tool 40. The wire damper 44 is configured to hold or release the wire 42 at a predetermined timing. Further, a wire tensioner 46 is provided above the wire damper 44. The wire 42 is inserted into and passes through the wire tensioner 46, so that the wire tensioner 46 applies adequate tension to the wire 42 during the bonding.

Materials suitable for use in the wire 42 are selected in terms of the workability, the low electric resistance, and the like as appropriate, and can include, for example, gold (Au), aluminum (Al), copper (Cu), silver (Ag), etc. A portion 43 of the wire 42 extending from the tip of the bonding tool 40 is bonded at a first bonding point.

The monitoring unit 70 monitors the state of the wire 42 inserted into and passing through the bonding tool 40 for a predetermined period of time in a wire bonding step. Specifically, the monitoring unit 70 supplies a predetermined electric signal between the wire 42 and the bonding target 100, and monitors whether the wire 42 is cut or not, based on an output of the supplied electric signal.

Here, as shown in FIGS. 4(A) and 4(B), the monitoring unit 70 includes a power supply unit 72, a measurement unit 74, and a determination unit 74. The monitoring unit 70 has one terminal thereof electrically connected to the bonding stage 16, and the other terminal thereof electrically connected to the wire damper 44 (or wire spool (not shown)). The power supply unit 72 is configured to supply the predetermined signal between the wire 42 and the bonding target 100. The measurement unit 74 is configured to measure an output of the supplied electric signal. The determination unit 76 is configured to determine the state of the wire 42 (whether the wire is cut or not) based on the output. For example, when the power source of the power supply unit 72 is an AC voltage power source, an impedance is measured by an impedance measurement circuit (not shown) inside the measurement unit 74, thereby detecting a capacitive component between the wire 42 and the boding stage 16. Based on an output associated with the detected capacitive component, the determination unit 76 determines whether the wire 42 is cut or not. Note that the output can be a capacitance itself. In this case, the determination unit 76 compares the capacitance as the output with a predetermined threshold. For example, when the capacitance is equal to or higher than the predetermined threshold, the wire 42 can be determined not to be cut. In contrast, when the capacitance is lower than the predetermined threshold, the wire 42 can be determined to be cut. Alternatively, the output related to the capacitive component can be a value obtained by computation of the capacitance. For example, the determination unit 76 can determine whether the wire 42 is cut or not based on a derivative determined with the change in capacitance over time.

When the wire 42 is not electrically connected to the bonding target 100, the capacitive component between the wire 42 and the bonding stage 16 is equal to a capacitance (wire-bonding-apparatus capacitance) of an element included in the wire bonding apparatus 1. In contrast, when the wire 42 is electrically connected to the bonding target 100 (for example, to both a semiconductor chip 110 and a substrate 120), the capacitive component between the wire 42 and the bonding stage 16 is the sum of the above-mentioned wire-bonding-apparatus capacitance and a capacitance (semiconductor-device capacitance) of the bonding target 100. In this way, the monitoring unit 70 can determine or monitor whether the wire 42 is cut or not after forming a wire loop between the first and second bonding points of the bonding target 100, based on the output related to the capacitive component between the bonding stage 16 and the wire 42 inserted into and passing through the bonding tool 40.

Returning to FIG. 1, the control unit 80 is connected to the XY drive mechanism 10, the Z drive mechanism 12, the ultrasonic horn 30 (ultrasonic vibrator 60), the load sensor 50, and the monitoring unit 70. The control unit 80 can control the operations of these components to perform necessary processes for the wire bonding. The control unit 80 includes, for example, interfaces (not shown) for transmitting and receiving signals with respect to the respective components, including the XY drive mechanism 10, the Z drive mechanism 12, the load sensor 50, the ultrasonic horn 30 (ultrasonic vibrator 60), the wire clamper 44, the load sensor 50, and the monitoring unit 70. Specifically, the control unit 80 performs the control of the operation of the bonding tool, including a moving distance in the X, Y, and Z-axis directions and a load in the Z direction of the bonding tool 40, an opening and closing operation of the wire clamper 44, the timing and time of the ultrasonic vibration generated in the bonding tool 40, and a scrub operation.

The control unit 80 is connected to an operation unit 82 for inputting control information, and a display unit 84 for outputting control information, so that an operator can input necessary control information by the operation unit 82 while recognizing it on a screen of the display unit 84. The control unit 80 is a computer device including a CPU and a memory. Bonding programs and the like for performing necessary processes for the wire bonding are previously stored in the memory. The control unit 80 is configured to perform respective steps for controlling the operation of the bonding tool 40 in a manufacturing method of the semiconductor device to be described later. (For example, the control unit 80 includes programs for causing the computer to execute the respective steps.)

Next, the manufacturing method of the semiconductor device according to this embodiment will be described with reference to FIGS. 3 to 6. The manufacturing method of the semiconductor device includes the wire bonding method performed using the above-mentioned wire bonding apparatus 1. The wire bonding in this embodiment is a wedge bonding system.

Figure 3:
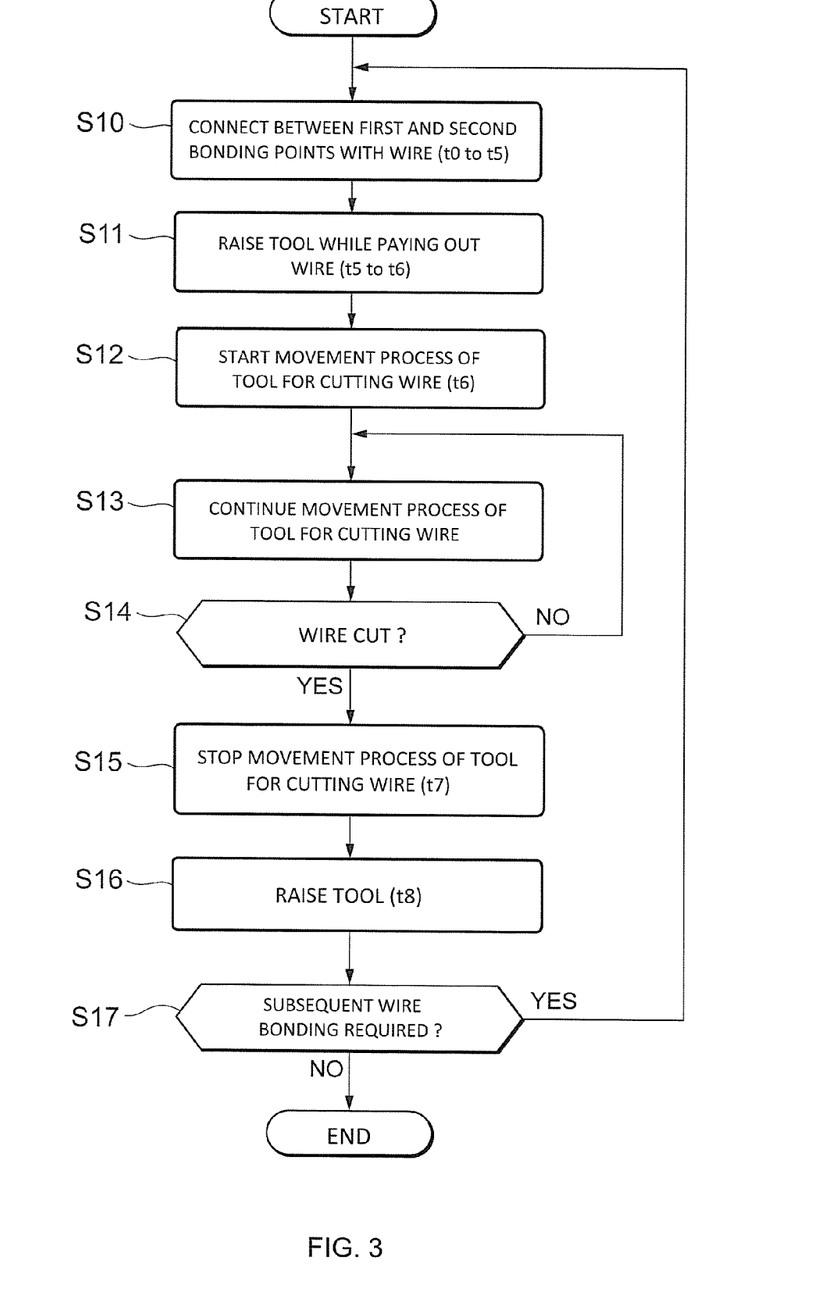
FIG. 3 is a flow chart of a manufacturing method of a semiconductor device according to the embodiment.
Figure 5:
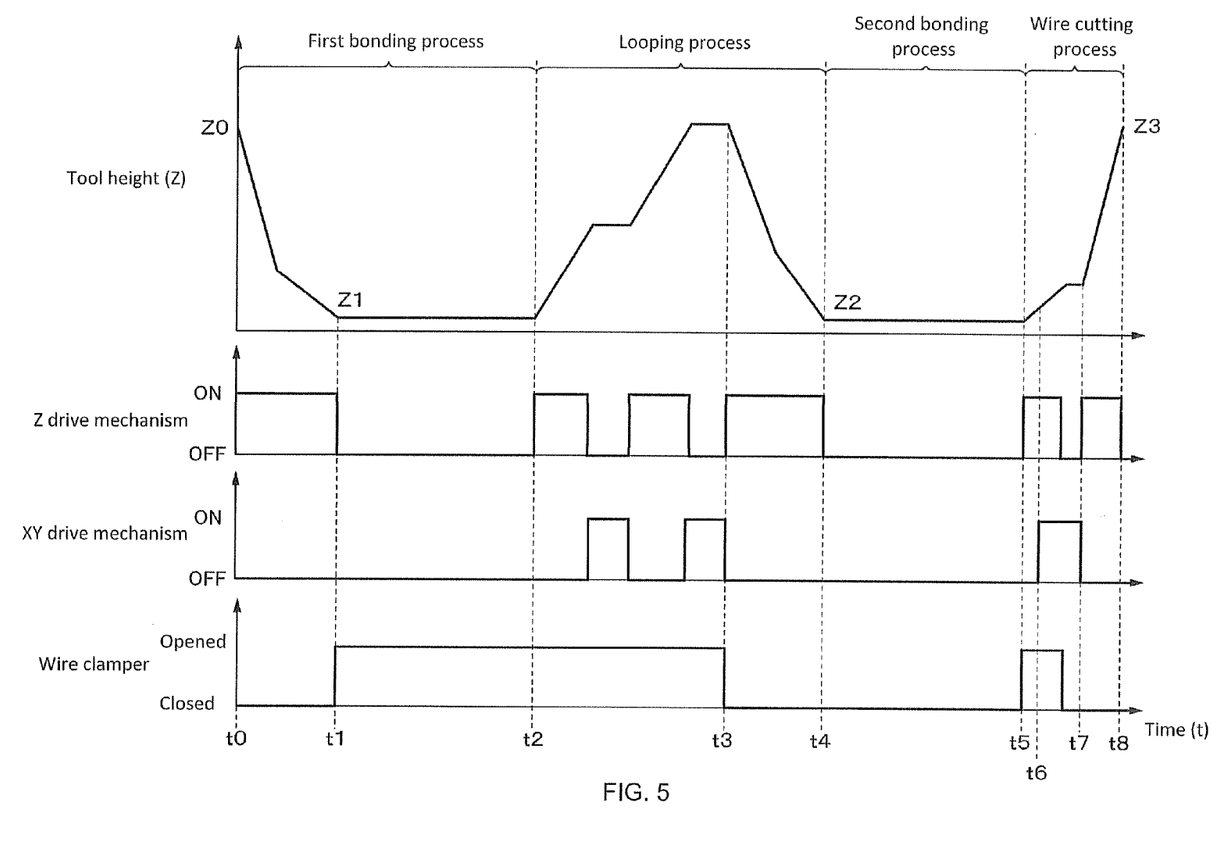
FIG. 5 shows timing charts regarding the manufacturing method of the semiconductor device according to the embodiment.
Figure 6:
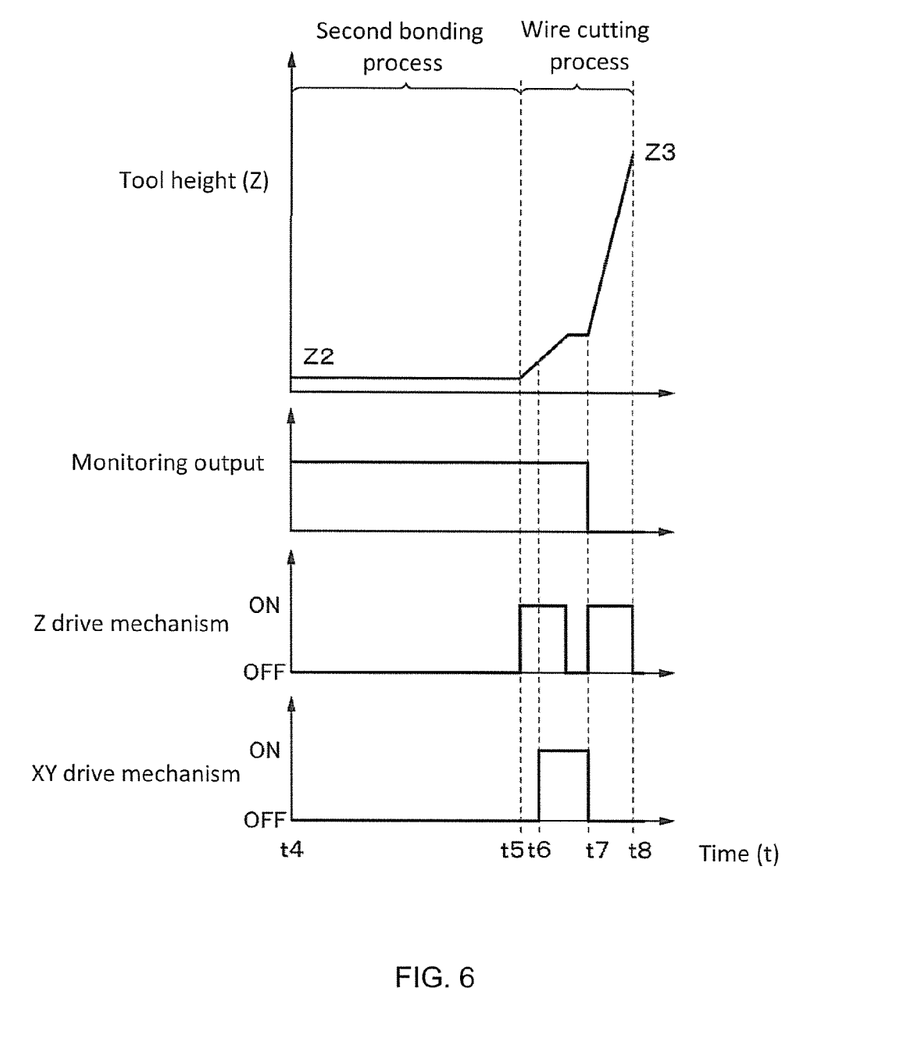
FIG. 6 shows other timing charts regarding the manufacturing method of the semiconductor device according to the embodiment.

Here, FIG. 3 is a flow chart of the manufacturing method of the semiconductor device, and FIGS. 4(A) and 4(B) illustrate the wire bonding process. FIGS. 5 and 6 are timing charts regarding the manufacturing method of the semiconductor device. The X, Y, and Z-axis directions shown in FIG. 4(A) can be applied to FIGS. 4(B), 5, and 6.

First, the bonding target 100 is prepared on the bonding stage 16.

As shown in FIG. 1, the bonding target 100 has a first bonding point and a second bonding point, which are electrically connected by the manufacturing method of the semiconductor device in this embodiment. Here, the first bonding point indicates a first-bonded one of two points connected together by the wire, while the second bonding point indicates the other of these two points that is bonded after the bonding of the first bonding point.

The bonding target 100 is a semiconductor device including at least one semiconductor chip, and, for example, as shown in FIG. 1, includes a semiconductor chip 110 with a plurality of electrodes 112 as the first bonding points, and a substrate 120 with a plurality of electrodes 122 as the second bonding points. Passivation (not shown) is formed as a protective film on a surface of the semiconductor chip 110 with the electrodes 112 formed (surface on a side where a semiconductor element is formed). The electrodes 112 are exposed from the respective openings of passivation 114. The semiconductor chip 110 is mounted on the substrate 120. In such a form, bonding the wire to the electrode 112 on the semiconductor chip 110 and to the electrode 122 on the substrate 120 in this order is normally called "forward bonding". Although in examples below, the forward bonding will be described by way of example, the wire bonding in this embodiment can be applied to the so-called "reverse bonding" which involves bonding a wire to the electrode 122 on the substrate 120 and to the electrode 112 on the semiconductor chip 110 in this order.

<Processes for a Period from Time t0 to Time t5>

As shown in FIG. 3, the electrode 112 as the first bonding point on the semiconductor chip 110 and the electrode 122 as the second bonding point on the substrate 120 are connected together by a wire (in S10). That is, as shown in FIG. 5, respective processes, namely, a first bonding process (from time t0 to time t2), a looping process (from time t2 to time t4), and a second bonding process (from time t4 to time t5) are performed.

Specifically, first, as shown in FIG. 5, for the period from time t0 to time t1, the Z drive mechanism 12 is operated to lower the bonding tool 40 from height Z0 to height Z1, and then the bonding tool 40 is pressurized for the period from time t1 to time t2. At this time, the portion of the wire 42 is pressurized by the pressing portion 47 (pressing surface 48) of the bonding tool 40 (see FIG. 4(A)), and then subjected to heat, ultrasound waves, and a scrub operation, whereby the wire 42 and the electrode 112 are bonded together.

Next, for the period from time t2 to time t3, the XY drive mechanism 10 and the Z drive mechanism 12 are appropriately operated to move the bonding tool 40 along a predetermined trajectory while paying out the wire 42, thereby looping the wire 42. When the bonding tool 40 is positioned above the second bonding point at time t3, the Z drive mechanism 12 is then operated for the period from time t3 to time t4 to lower the bonding tool to the height Z2. Note that the wire damper 44 is kept opened for the period from time t1 to time t3.

Thereafter, the bonding tool 40 is pressurized for the period from time t3 to time t4. At this time, in the same way as the bonding at the first bonding point, the portion of the wire 42 is pressurized with the pressing portion 47 (pressing surface 48) of the bonding tool 40 (see FIG. 4(A)), and then subjected to heat, ultrasound waves, and a scrub operation, whereby the wire 42 and the electrode 112 are bonded together.

In this way, as shown in FIG. 4(A), a wire loop 90 is formed to connect both the electrode 112 as the first bonding point and the electrode 122 as the second bonding point. Note that FIG. 4(A) is a diagram corresponding to time t5.

<Processes for a Period from Time t5 to Time t8 (Wire Cutting Process)>

After finishing the bonding at the second bonding point, the bonding tool 40 is raised while paying out the wire 42 (in S11), and then, a movement process of the tool for cutting the wire is started (in S12). For example, as shown in FIG. 5, at the time t5, the Z drive mechanism 12 is operated to raise the bonding tool 40, and then the XY drive mechanism 10 is operated to move the bonding tool 40 in the direction (Y direction) away from the wire loop 90. During this time, as shown in FIG. 5, the wire damper 44 is opened. In this way, the wire 42 is paid out only by a predetermined amount from the tip of the bonding tool 40 along with the movement amount of the bonding tool 40, thus allowing the wire 42 with a predetermined length to extend between the tip of the bonding tool 40 and the second bonding point.

Thereafter, the movement process of the bonding tool 40 for cutting the wire 42 is continued (in S13). For example, as shown in FIG. 5, the XY drive mechanism 10 is further operated to move the bonding tool 40 in the direction away from the wire loop 90. In this way, for a period from time t5 to time t6 (during an operation period of the XY drive mechanism 10), a tensile stress is applied onto the wire 42. At this time, as shown in FIG. 5, the wire damper 44 is closed at any timing in the period from time t5 to time t6, thereby enabling the application of the larger tensile stress to the wire 42.

In this embodiment, during a period of the wire cutting process, the monitoring unit 70 monitors whether the wire is cut or not (in S14). Specifically, the monitoring unit 70 supplies a predetermined electric signal between the wire 42 and the bonding target 100 after time t5, determines and monitors whether the wire 42 is cut or not, based on an output of the supplied electric signal. The electric signal is supplied continuously in terms of time, and the monitoring is executed based on the output of the continuous response to the signal.

When the supplied electric signal is an AC electric signal, for example, the capacitive component between the wire 42 and the bonding stage 16 can be measured as the monitoring output. While the wire 42 is electrically connected to the bonding target 100, the capacitive component between the wire 42 and the bonding stage 16 is the sum of the wire-bonding-apparatus capacitance and a capacitance of the bonding target 100 (semiconductor-device capacitance). Thus, as shown in FIG. 6, the monitoring output is at a high level for the period from time t4 to time t7. Then, when the tensile stress is applied to the wire 42 at time t7 to cut the wire 42, the capacitive component decreases to the wire-bonding-apparatus capacitance, whereby the monitoring output is at a low level after time t7. In this way, the monitoring unit 70 (determination unit 76) determines that the wire 42 is not cut while the monitoring output is kept at the high level. In contrast, when the monitoring output for the wire 42 is transferred to the low level, the wire 42 is determined to be cut. Note that such determination can be made by comparison with a predetermined threshold (for example, an intermediate value between the high and low levels).

The control unit 80 receives a signal based on such a monitoring result from the monitoring unit 70, and controls the operation associated with the movement process of the bonding tool based on the monitoring result.

Specifically, when the wire 42 is determined by the monitoring unit 70 not to be cut, the control unit 80 continues the movement process of the bonding tool 40 for cutting the wire 42 (if No in S14 and in S13 as shown in FIG. 3). That is, as shown in FIGS. 5 and 6, the movement process of the bonding tool 40 by the XY drive mechanism 12 is continued. Note that a series of processes shown in S13 and S14 of FIG. 3 is repeated until the wire 42 is determined to be cut.

In contrast, when the wire 42 is determined by the monitoring unit 70 to be cut, the control unit 80 stops the movement process of the bonding tool 40 for cutting the wire 42 (if Yes in S14 and in S15 as shown in FIG. 3). That is, as shown in FIGS. 5 and 6, at time t7, the movement process of the bonding tool 40 by the XY drive mechanism 12 is stopped. Thereafter, as shown in FIG. 3, in the following process, for example, the Z drive mechanism 10 is operated to raise the bonding tool 40 up to height Z3 in the direction vertical to the bonding surface (in S16). Note that FIG. 4(B) is a diagram corresponding to time t7.

Note that when the monitoring unit 70 determines that the wire 42 is cut before starting the movement process of the bonding tool 40 for cutting the wire 42, the monitoring unit 70 or control unit 80 can be configured to indicate that the cutting of the wire 42 is abnormal. For example, if the wire 42 is cut when raising the bonding tool 40 while paying out the wire 42 for the period from time t5 to time t6, the wire 42 with the predetermined length cannot be paid out yet from the tip of the bonding tool. Thus, such cutting of the wire 42 can be determined to be abnormal. In this case, when the monitoring unit 70 determines that the wire 42 is cut at such timing, the control unit 80 can display this cutting, for example, on a screen of the display unit 84.

In this way, a portion of the wire 42 is cut to form the wire tail 43 at the tip of the bonding tool 40 as shown in FIG. 4(B). Since the bonding tool 40 is moved in the direction parallel to the bonding surface to thereby cut the wire 42, the wire tail 43 is bent in a direction intersecting the Z direction along the movement direction of the bonding tool 40. For example, the bonding tool 40 can be moved on the straight line in the Y direction that connects the first bonding point to the second bonding point, causing the wire tail 43 to extend and be bent in this Y direction.

Thus, as shown in FIG. 4(B), a wire loop 130 can be formed to extend in a predetermined shape that connects between the first bonding point and the second bonding point. The wire loop 130 has a first bonded portion 132 above the electrode 112 as the first bonding point, and a bonded portion 134 above the electrode 122 as the second bonding point.

<Process After Time t8>

After raising the bonding tool 40 up to the height Z3, as shown in FIG. 3, it is determined whether the subsequent wire bonding is necessary or not on the bonding target 100 (in S17). If the subsequent wire bonding is determined to be necessary (if Yes in S17), the bonding tool 40 is moved to the first bonding point for the subsequent wire bonding, and the wire tail 43 is bonded to the first bonding point, followed by repetition of a series of steps S10 to S16. In contrast, if the subsequent wire bonding is determined not to be necessary, and the wire bonding for the bonding target 100 is all finished (if No in S17), the wire bonding step for the bonding target 100 is terminated.

As mentioned above, in this embodiment, it is monitored whether the wire is cut or not, based on the output of the electric signal supplied between the wire 42 and the bonding target 100. Based on the monitoring result, when the wire is determined to be cut, the movement process of the bonding tool for cutting the wire is stopped. Therefore, for example, at the same time as the cutting of the wire 42, the movement process of the bonding tool 40 is stopped, and then can be quickly transferred to a subsequent movement process, which can shorten the operation time of the wire bonding. The cutting process of the wire 42 can be automated, so that setting of a parameter associated with the wire bonding can be simplified. Thus, the process efficiency of the wire bonding can be improved.

The present invention is not limited to the embodiments described above, and various modifications and changes can be made to these embodiments.

Although in the above-mentioned embodiment, the period for monitoring the state of the wire by the monitoring unit 70 is set to a time period from time t5 to time t7, the invention is not limited thereto. Alternatively, for example, the monitoring period can be one from time t6, at which the operation of the XY drive mechanism 12 starts, to time t7, or alternatively, can be the entire time period for the wire bonding step. The movement process of the bonding tool 40 for cutting the wire can be performed by operating both the XY drive mechanism 10 and the Z drive mechanism 12. Note that the timing charts of FIGS. 5 and 6 are illustrated only, and the invention is not limited to these examples.

The movements in the X, Y, and Z directions of the bonding tool 40 are not limited to the structures described in the above embodiment by way of example, and can include, for example, not only a straight trajectory but also a curved trajectory. Further, the shape of the bonding tool 40 is not limited to that shown in the figure.

Although in the above-mentioned embodiment, the monitoring unit 70 supplies the AC electric signal, the invention is not limited thereto. Alternatively, a DC pulse signal can be supplied. In this case, the power supply unit 72 can serve as the DC pulse power source, and the measurement unit 74 can measure a voltage value between the wire 42 and the bonding stage 16. That is, whether the wire 42 is cut or not can be determined or monitored by reading out a change in voltage value that is caused by the electric connection or disconnection of the wire 42 to the bonding target 100.

The examples and applied examples that have been described above through the embodiments of the invention can be combined as appropriate, and changed or modified depending on the applications. Therefore, the present invention is not limited to the description of the embodiments above. It is obvious from the accompanying claims that such combinations, changes or modifications of the examples or embodiments can be included in the technical scope of the present invention.

REFERENCE SIGN LIST

1 . . . Wire bonding apparatus, 40 . . . Bonding tool (capillary), 42 . . . Wire, 70 . . . Monitoring unit, 80 . . . Control unit

The invention claimed is:
1. A wire bonding apparatus, comprising:
a bonding tool for allowing a wire to be inserted thereinto and to pass therethrough;
a control unit that performs a movement process of the bonding tool for cutting the wire after forming a wire loop between a first bonding point and a second bonding point of a bonding target; and
a monitoring unit that supplies a predetermined electric signal between the wire inserted into and passing through the bonding tool and the bonding target, and monitors whether the wire is cut or not based on an output of the supplied electric signal, wherein
the control unit is configured to continue the movement process of the bonding tool during a period in which the wire is determined not to be cut, and to stop the movement process of the bonding tool when the wire is determined to be cut, based on a monitoring result from the monitoring unit.

2. The wire bonding apparatus according to claim 1, wherein
the predetermined electric signal is an alternate-current electric signal or a direct-current pulse signal.

3. The wire bonding apparatus according to claim 2, wherein
an output of the supplied electric signal is an output associated with a capacitance between the wire and the bonding target, and
the monitoring unit is configured to determine whether the wire is cut or not based on comparison between the output associated with the capacitance and a predetermined threshold.

4. The wire bonding apparatus according to claim 1, wherein
the monitoring unit is configured to indicate that cutting of the wire is abnormal when the wire is determined to be cut before starting the movement process of the bonding tool for cutting the wire.

5. The wire bonding apparatus according to claim 1, wherein
the wire bonding to be performed on the bonding target is a wedge bonding system.

6. The wire bonding apparatus according to claim 1, wherein
the movement process of the bonding tool for cutting the wire includes moving the bonding tool in a direction parallel to a bonding surface.

7. The wire bonding apparatus according to claim 1, wherein
the control unit is configured to move the bonding tool in a direction vertical to a bonding surface while stopping the movement process of the bonding tool for cutting the wire, when the monitoring unit determines that the wire is cut.

8. The wire bonding apparatus according to claim 1, wherein
the wire is an aluminum wire.

9. A method of manufacturing a semiconductor device, the method including cutting a wire after forming a wire loop between a first bonding point and a second bonding point of a bonding target by means of a bonding tool, the method comprising:
supplying a predetermined electric signal between the wire inserted into and passing through the bonding tool and the bonding target, thereby monitoring whether the wire is cut or not based on an output of the supplied electric signal, wherein
the wire cutting step includes continuing the movement process of the bonding tool for cutting the wire during a period in which the wire is determined not to be cut, and stopping the movement process of the bonding tool when the wire is determined to be cut, based on a result of the monitoring.

* * * * *